US009859284B2

(12) United States Patent
Wang

(10) Patent No.: US 9,859,284 B2
(45) Date of Patent: Jan. 2, 2018

(54) SEMICONDUCTOR MEMORY DEVICE HAVING ENLARGED CELL CONTACT AREA AND METHOD OF FABRICATING THE SAME

(71) Applicant: Micron Technology, Inc., Boise, ID (US)

(72) Inventor: Kuo-Chen Wang, New Taipei (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/002,401

(22) Filed: Jan. 21, 2016

(65) Prior Publication Data

US 2017/0213834 A1    Jul. 27, 2017

(51) Int. Cl.
  *H01L 27/108* (2006.01)

(52) U.S. Cl.
  CPC .. *H01L 27/10888* (2013.01); *H01L 27/10814* (2013.01); *H01L 27/10855* (2013.01); *H01L 27/10885* (2013.01); *H01L 27/10891* (2013.01); *H01L 2924/1436* (2013.01)

(58) Field of Classification Search
  CPC ......... H01L 27/10882; H01L 27/10855; H01L 27/10885; H01L 27/10891; H01L 27/10814; H01L 27/10888
  See application file for complete search history.

(56) References Cited

U.S. PATENT DOCUMENTS

| 5,753,947 | A | 5/1998 | Gonzalez |
| 6,734,482 | B1 | 5/2004 | Tran et al. |
| 2002/0052077 | A1 | 5/2002 | Tee |
| 2006/0043450 | A1 | 3/2006 | Tang et al. |
| 2011/0037111 | A1* | 2/2011 | Kim .................. H01L 27/10885 257/302 |
| 2011/0156118 | A1* | 6/2011 | Park ..................... H01L 27/0207 257/306 |
| 2012/0217559 | A1 | 8/2012 | Kim |
| 2013/0015551 | A1* | 1/2013 | Wang ................ H01L 27/10882 257/499 |

(Continued)

FOREIGN PATENT DOCUMENTS

| KR | 1020120119093 A | 10/2012 |
| KR | 1020140052729 A | 5/2014 |

OTHER PUBLICATIONS

Notice of Reasons for Rejection from Korean Application No. 10-2016-0022059, dated Jun. 1, 2017, 14 pages with English translation.

(Continued)

*Primary Examiner* — Tom Thomas
*Assistant Examiner* — Vincent Wall
(74) *Attorney, Agent, or Firm* — TraskBritt

(57) ABSTRACT

A memory array includes a semiconductor substrate having thereon a plurality of active areas and trench isolation regions between the active areas. Buried word lines are disposed in the semiconductor substrate. Two of the buried word lines intersect with each of the active areas, separating each of the active areas into three portions including a digit line contact area and two cell contact areas. Buried digit lines are disposed in the semiconductor substrate above the buried word lines. An epitaxial silicon layer extends from exposed sidewalls and a top surface of each of the cell contact areas.

10 Claims, 21 Drawing Sheets

(56) References Cited

U.S. PATENT DOCUMENTS

2014/0159194 A1    6/2014  Song et al.

OTHER PUBLICATIONS

Furumura, "Selective Growth of Polysilicon", J. Electrochem. Soc.: Solid State Science and Technology, Feb. 1986, pp. 379-383.
Korean Written Opinion from Korean Application No. 10-2016-0022059, dated Aug. 1, 2017, 7 pages with English translation.
Taiwanese Office Action, dated Sep. 8, 2017, and Search Report, dated Sep. 1, 2017 for Taiwanese Application No. 105108230, 10 pages with English translation.

* cited by examiner

SEMICONDUCTOR MEMORY DEVICE HAVING ENLARGED CELL CONTACT AREA AND METHOD OF FABRICATING THE SAME

TECHNICAL FIELD

This invention relates generally to semiconductor memory devices and a method of fabricating the same. More particularly, the present invention relates to a memory device including buried (or damascened) digit lines (BDLs)/buried word lines (BWLs), as well as enlarged cell contact areas, in the cell array, and a method of fabricating the same.

BACKGROUND

As known in the art, a dynamic random access memory (DRAM) device is made up of memory cells. Each cell of a DRAM device comprises a transistor and a capacitor electrically coupled to a terminal such as the drain (or source) of the transistor. A digit line is electrically coupled to another terminal such as the source (or drain) of the transistor. The memory cells are addressed via a word line and the digit line, one of which addresses a "column" of memory cells while the other addresses a "row" of the memory cells.

One type of the typical DRAM device utilizes buried word line (BWL) architecture comprising parallel word lines embedded in a cell array. The buried word lines are fabricated in word line trenches that intersect with the active areas (AAs). The capacitor is stacked on a major surface of the silicon substrate and the digit line is constructed over the major surface of the silicon substrate and over the capacitor.

As the size of DRAM cell shrinks, the surface area of the AA becomes smaller and smaller. The decreasing surface area of the AAs results in insufficient cell contact area (or landing area) for the capacitors and decreased process window when forming a cell contact layer (or landing pad). Additionally, there is a continuing goal to further decrease the cell area. Therefore, it has become a major issue in this technical field to cope with the insufficient cell contact area and narrow process window.

BRIEF SUMMARY

It is one object of the invention to provide an improved DRAM device comprised of a plurality of memory cells having an effective cell size of $6F^2$ and an enlarged cell contact area.

It is another object of the invention to provide an improved DRAM device having buried digit lines/word lines and a capacitor-over-digit line structure.

It is another object of the invention to provide a method for fabricating a DRAM device without the need of forming a cell contact layer or a landing pad.

According to one embodiment of the invention, a method for fabricating a memory array is disclosed. A semiconductor substrate is provided. A plurality of active areas and a trench isolation region isolating the plurality of active areas from one another are formed. The active areas extend along a first direction. Buried word lines extending along a second direction are formed in the semiconductor substrate. Two of the buried word lines intersect with each of the active areas, separating each of the active areas into three portions including a digit line contact area and two cell contact areas. The second direction is not perpendicular to the first direction. Buried digit lines extending along a third direction in the semiconductor substrate are formed above the buried word lines. The third direction is substantially perpendicular to the second direction. An upper portion of the trench isolation region is selectively removed to form an L-shaped recessed area around each of the two cell contact areas. The L-shaped recessed area exposes sidewalls of each of the two cell contact areas. An epitaxial silicon growth process is then performed to grow an epitaxial silicon layer from the exposed sidewalls and a top surface of each of the cell contact areas, thereby forming enlarged cell contact areas.

According to one aspect of the invention, a memory array is disclosed. The memory array includes a semiconductor substrate having thereon a plurality of active areas and a trench isolation region between the active areas. The active areas extend along a first direction. Buried word lines extend along a second direction in the semiconductor substrate. Two of the buried word lines intersect with each of the active areas, separating each of the active areas into three portions including a digit line contact area and two cell contact areas. The second direction is not perpendicular to the first direction. Buried digit lines extend along a third direction in the semiconductor substrate above the buried word lines. The third direction is substantially perpendicular to the second direction. An epitaxial silicon layer extends from exposed sidewalls and a top surface of each of the cell contact areas.

These and other objectives of the present invention will no doubt become obvious to those of ordinary skill in the art after reading the following detailed description of the preferred embodiment that is illustrated in the various drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 1A-7C are schematic diagrams illustrating a method for fabricating a memory device with buried digit lines and buried word lines integrated in a memory array of the memory device in accordance with one embodiment of the present invention, wherein:

FIGS. 1A-7A are top views of schematic layout diagrams of a memory array of the memory device in different manufacturing stages according to an exemplary embodiment of the invention; and FIGS. 1B-7B and 1C-7C are schematic, cross-sectional views taken along lines I-I' and II-II', respectively, in the layout diagrams depicted in FIGS. 1A-7A.

Figure 1A:
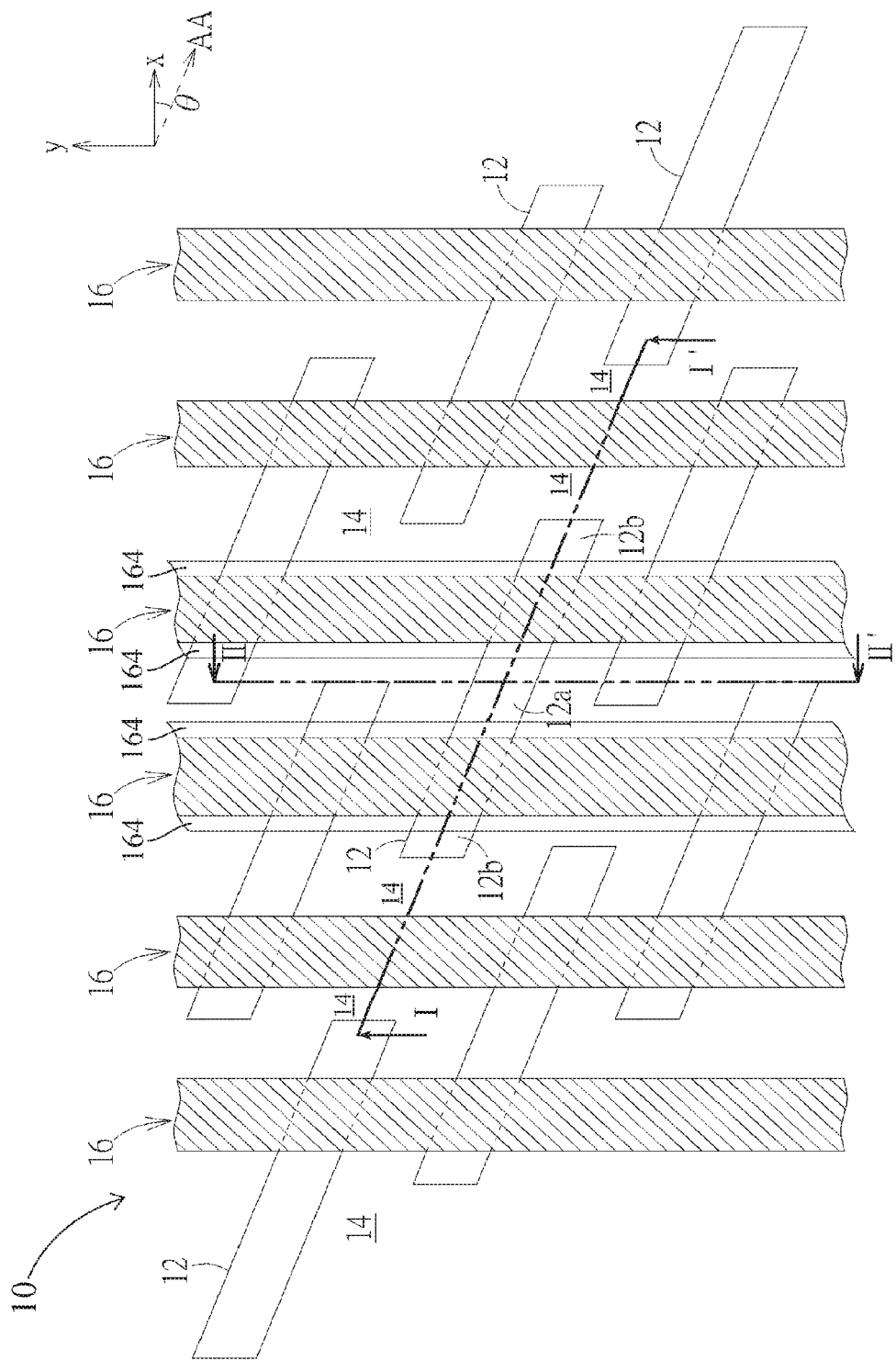

It should be noted that all the figures are diagrammatic. Relative dimensions and proportions of parts of the drawings have been shown exaggerated or reduced in size, for the sake of clarity and convenience in the drawings. The same reference numerals are generally used to refer to corresponding or similar features in modified and different embodiments.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the accompanying drawings, wherein like reference numerals are used to refer to like elements throughout, and wherein the illustrated structures are not necessarily drawn to scale.

The terms "wafer" and "substrate" used herein include any structure having an exposed surface onto which a layer is deposited according to the present invention, for example, to form the integrated circuit (IC) structure. The term "substrate" is understood to include semiconductor wafers. The term "substrate" is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

The term "horizontal" as used herein is defined as a plane parallel to the conventional major plane or surface of the semiconductor substrate, regardless of its orientation. The term "vertical" refers to a direction perpendicular to the horizontal as just defined. Terms, such as "on," "above," "below," "bottom," "top," "side" (as in "sidewall"), "higher," "lower," "over," and "under," are defined with respect to the horizontal plane.

The present invention pertains to an improved DRAM device that is comprised of a plurality of memory cells having an effective cell size of $6F^2$ (e.g., $3F \times 2F$) and an enlarged cell contact area. The enlarged cell contact area involves the use of inventive self-constrained epitaxial growth technology, which effectively avoids shorting between neighboring cells.

The width of the feature is also referred to as the CD or minimum feature size ("F") of the line. The CD is typically the smallest geometrical feature, such as the width of an interconnect line, contact, or trench, that is formed during IC manufacturing using a given technology, such as photolithography.

Figure 1B:
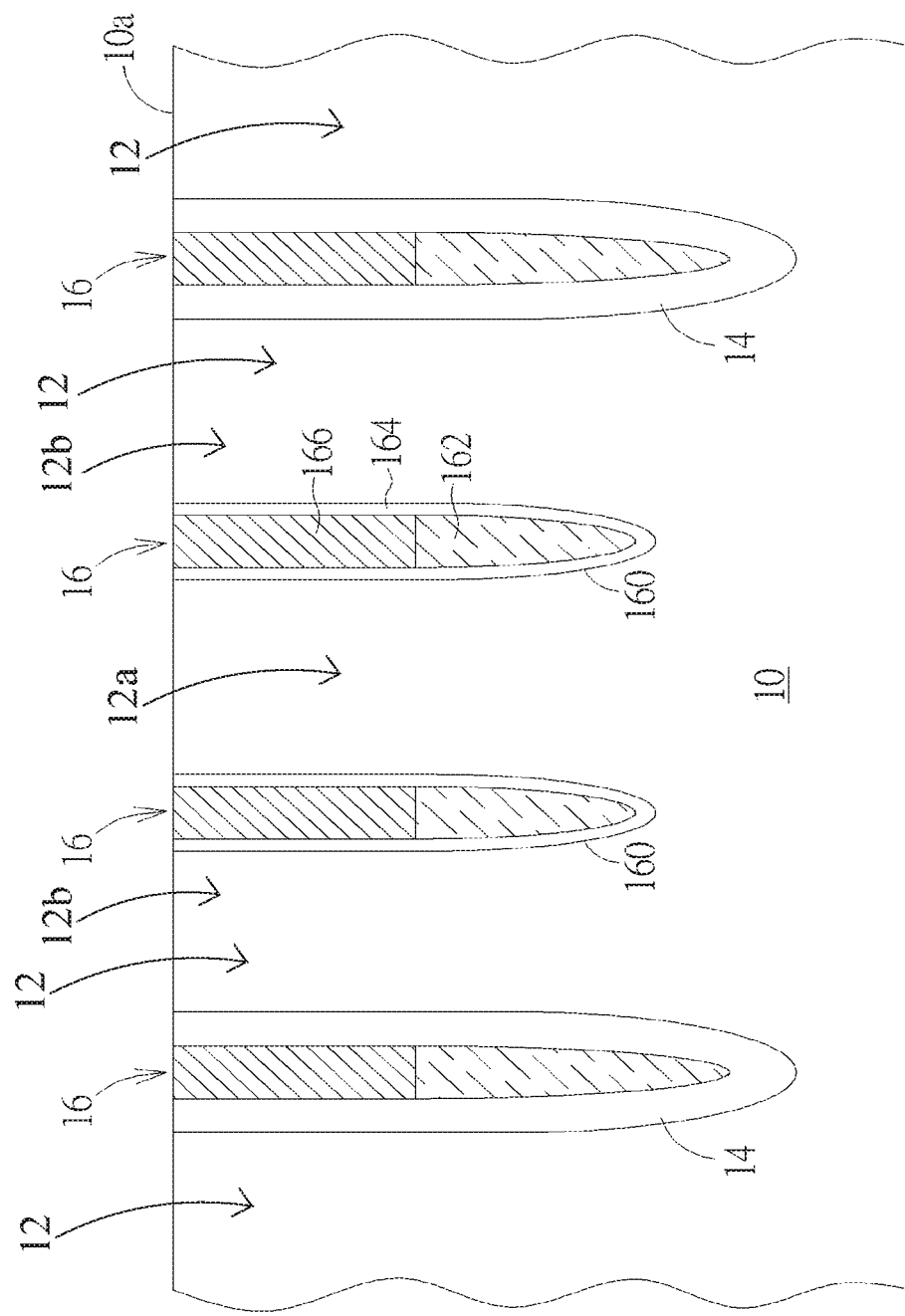
Figure 1C:
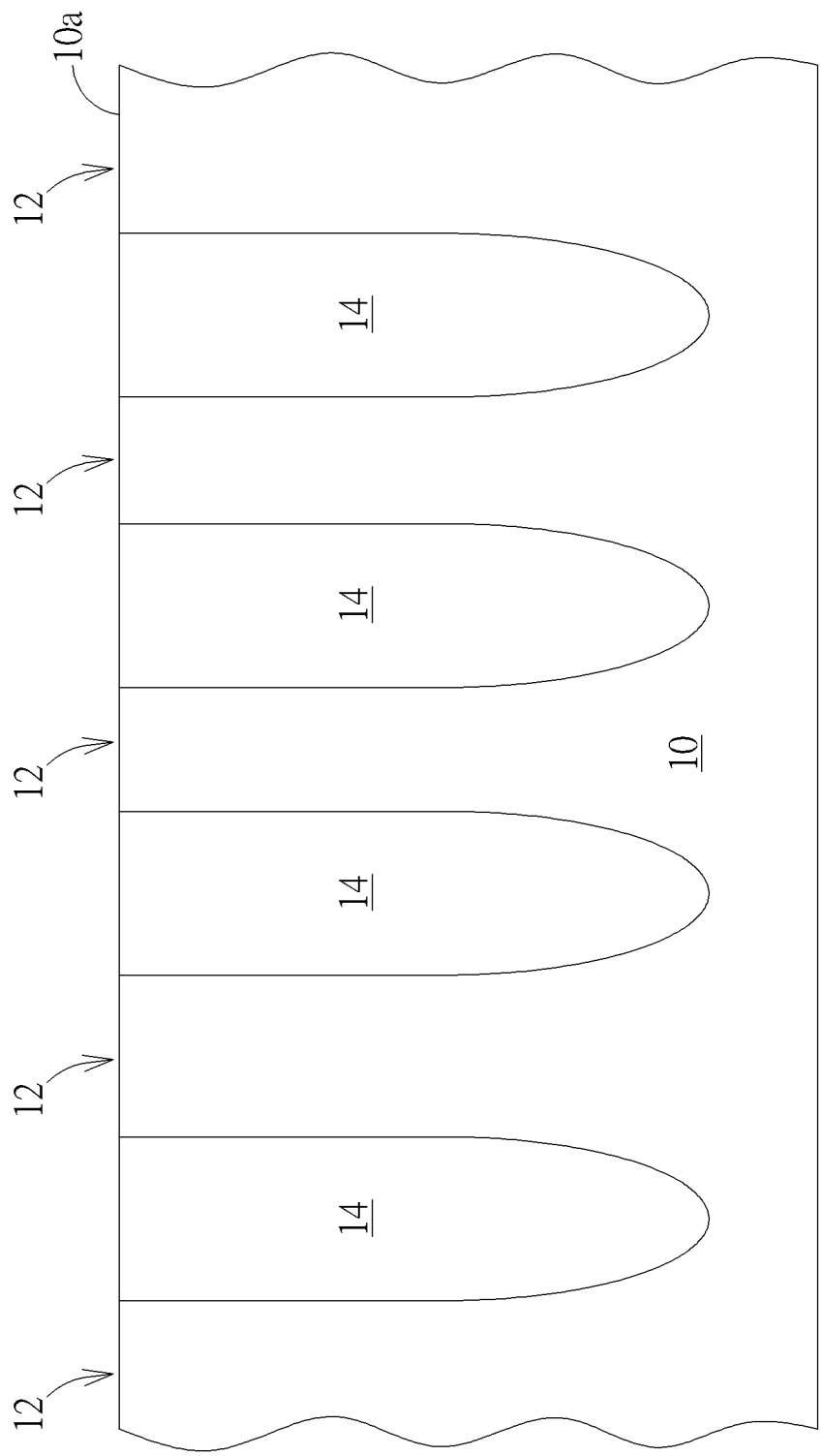

Please refer to FIGS. 1A, 1B and 1C. FIG. 1A is a top view of the schematic layout of the memory array of the memory device after the formation of columns of buried word lines (BWLs) according to one embodiment of the invention. FIGS. 1B and 1C are schematic, cross-sectional views taken along lines I-I' and II-II', respectively, in FIG. 1A. First, a semiconductor substrate 10 such as a silicon wafer is provided. A plurality of active areas 12 is formed in the semiconductor substrate 10. Shallow trench isolation (STI) structures 14 are provided between the active areas 12 to isolate active areas 12 from one another. The formation of the STI structures 14 is known in the art. However, it is noted that the STI structure described herein may include additional features than those known in the art. For example, using conventional lithographic processes, a photoresist pattern (not shown) may be formed on the semiconductor substrate 10, which defines trench patterns to be etched into the semiconductor substrate 10. Using the photoresist pattern as a hard mask, a dry etching process is performed to etch the semiconductor substrate 10 to thereby form trenches. The trenches are then filled with insulating materials such as silicon oxide. The longitudinal direction of each active area 12 extends along a reference AA direction. Each active area 12 has a longer side that is in parallel with the longitudinal direction of each active area 12. An included angle (acute angle) θ between the reference AA direction and a reference x-axis direction may range between 15° and 60°, but should not be limited thereto.

After the formation of the STI structures 14 and the active areas 12, columns of line-shaped buried word lines 16 are fabricated in the semiconductor substrate 10. As can be seen in FIG. 1A, the columns of line-shaped buried word lines 16 extend along a reference y-axis, and two buried word lines 16 intersect with each active area 12, thereby separating each active area into three portions including a digit line contact area 12a and two cell contact areas (or capacitor landing areas) 12b. As can be best seen in FIG. 1A, the two cell contact areas 12b are located at two distal ends of each active area 12, and the digit line contact area 12a is between two line-shaped buried word lines 16.

As best seen in FIG. 1B, each of the buried word lines 16 includes a conductive portion 162 embedded at a lower portion of a word line trench 160. The conductive portion 162 may comprise a layer of metal, metal composite or layers of conductive materials. For example, the conductive portion 162 may comprise titanium nitride (TiN), titanium/titanium nitride (Ti/TiN), tungsten nitride (WN), tungsten/tungsten nitride (W/WN), tantalum nitride (TaN), tantalum/tantalum nitride (Ta/TaN), titanium silicon nitride (TiSiN), tantalum silicon nitride (TaSiN), and tungsten silicon nitride (WSiN), or a combination thereof. The conductive portion 162 is encapsulated by an insulating layer 164 such as silicon oxide lining an interior surface of the word line trench 160 and a cap layer 166 situated atop the conductive portion 162. The cap layer 166 has a top surface that is flush with a top surface 10a of the semiconductor substrate 10. For example, the cap layer 166 may comprise silicon nitride, but is not limited thereto.

Figure 2A:
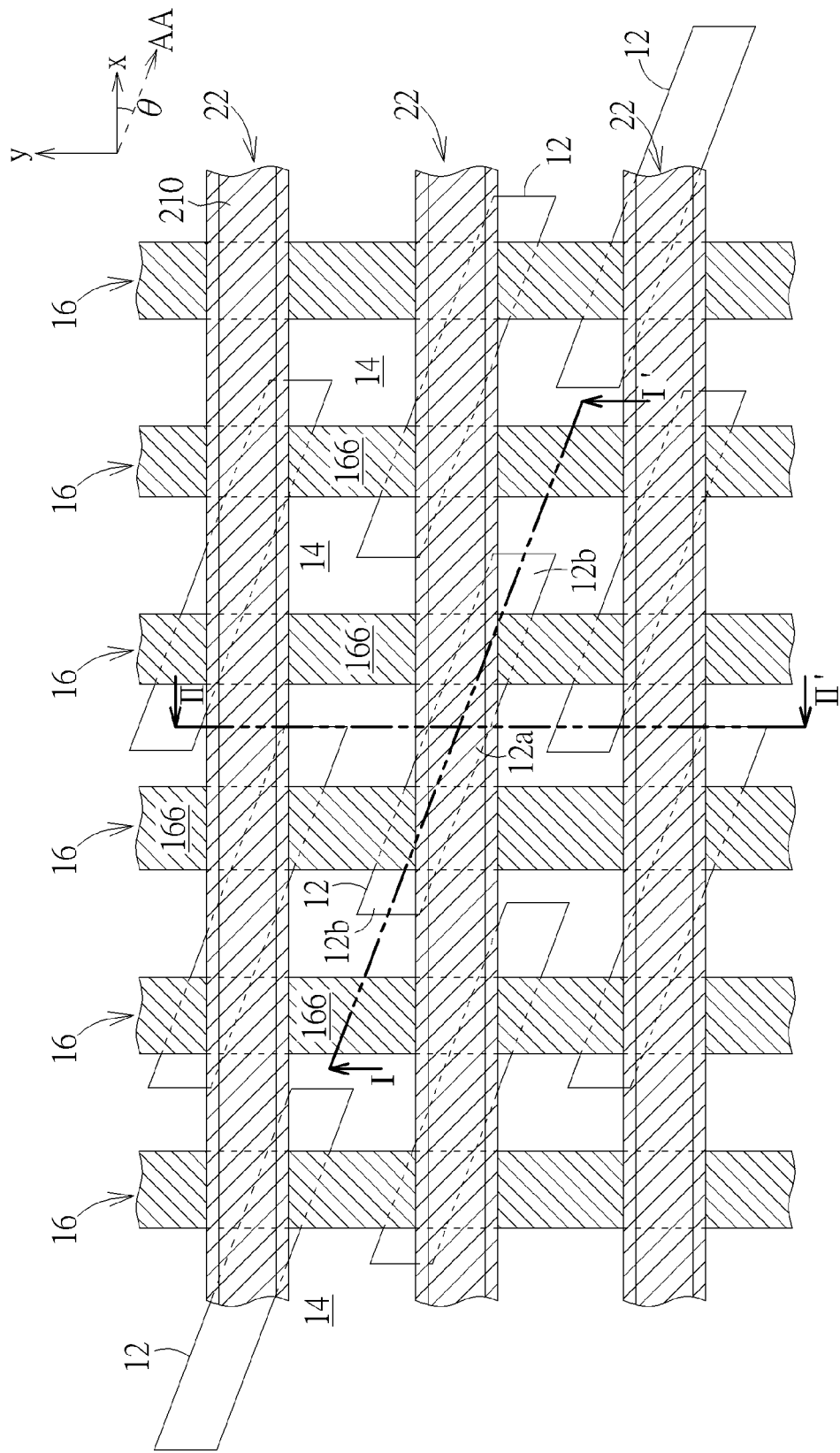
Figure 2B:
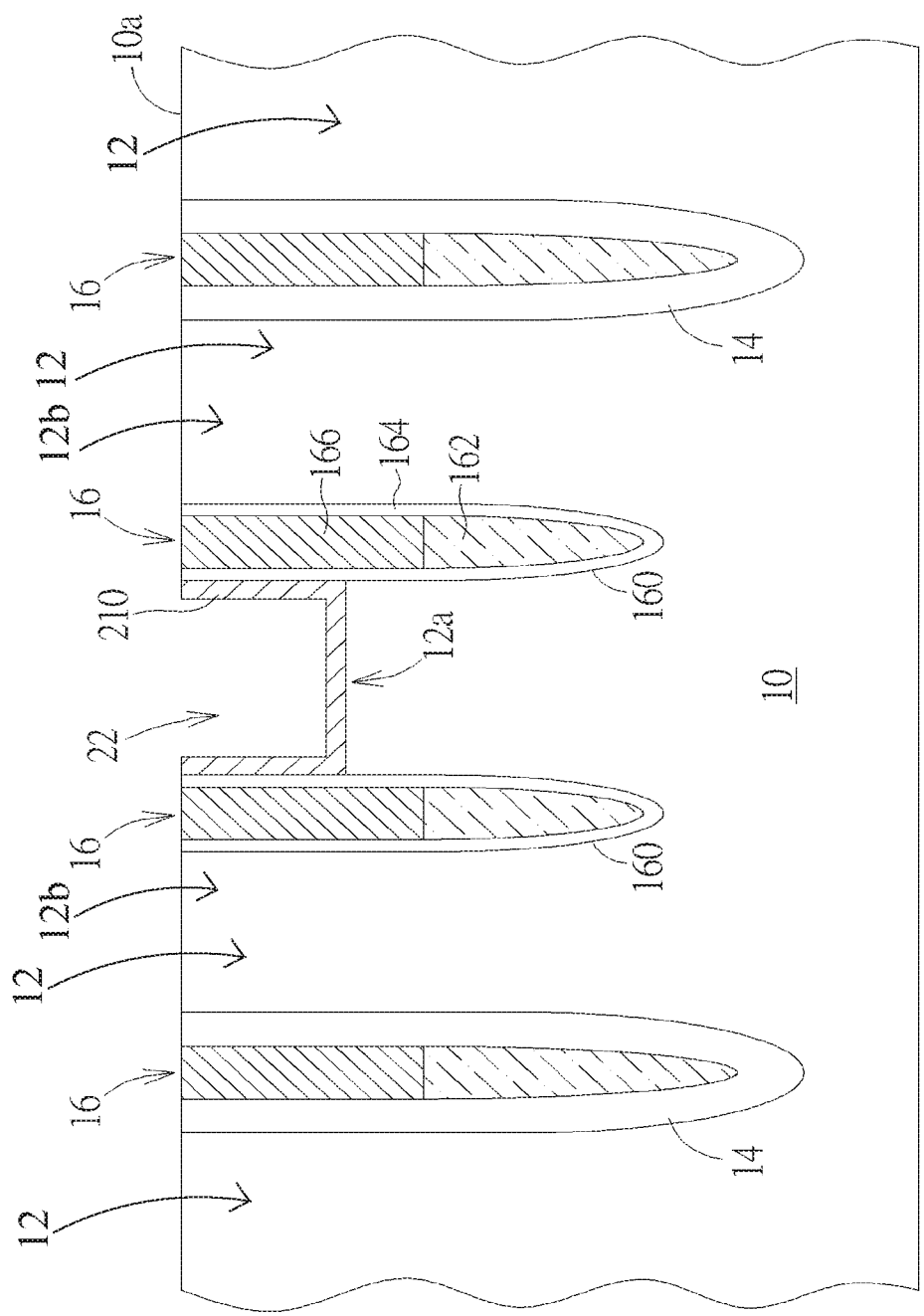
Figure 2C:
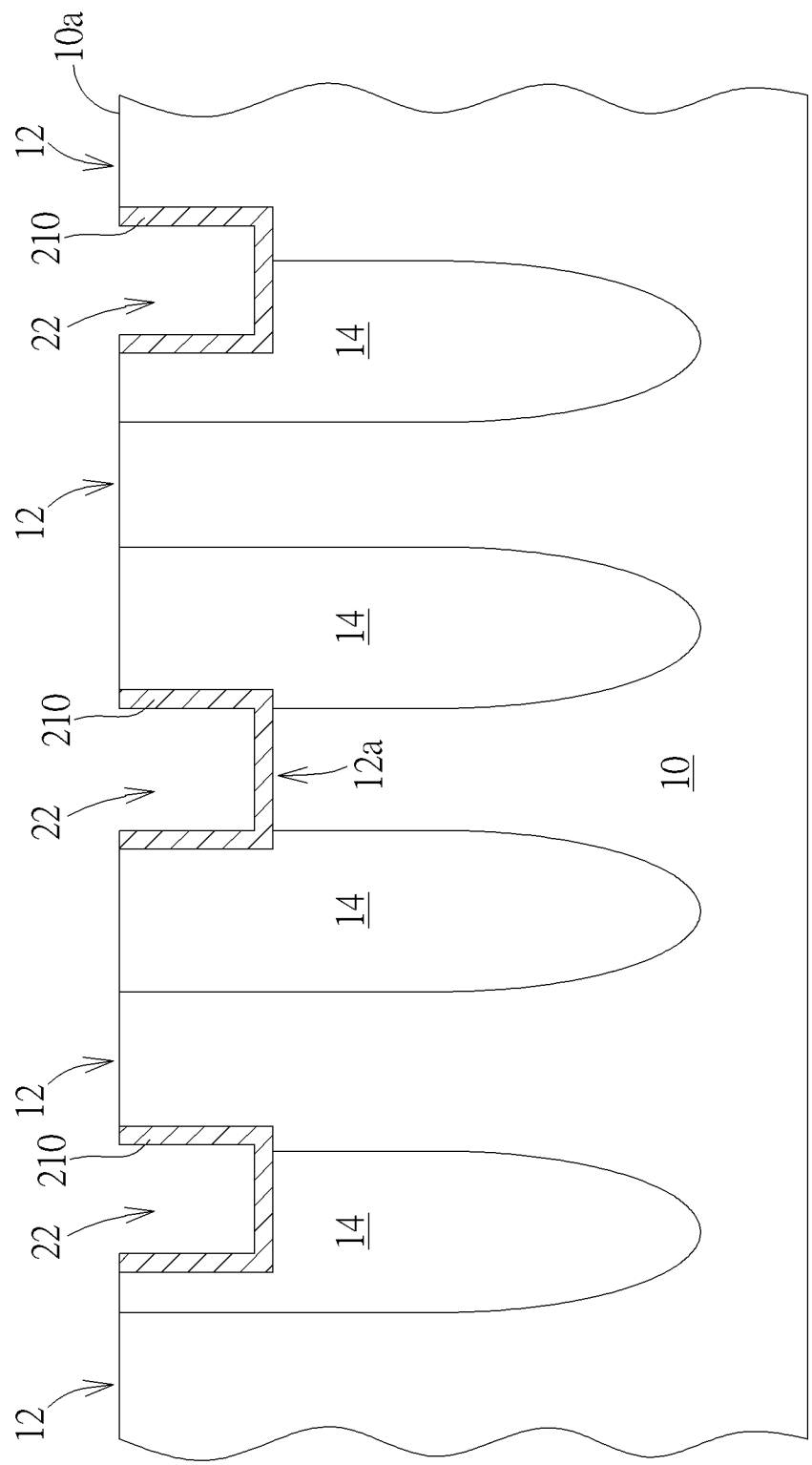

Please refer to FIGS. 2A, 2B and 2C. FIG. 2A is a top view of the schematic layout of the memory array of the memory device after the formation of buried digit line (BDL) trenches according to one embodiment of the invention. FIGS. 2B and 2C are schematic, cross-sectional views taken along lines I-I' and II-II', respectively, in FIG. 2A. As shown in FIG. 2A, rows of BDL trenches 22 are formed and are recessed into the top surface 10a of the semiconductor substrate 10. The rows of BDL trenches 22 extend along the reference x-axis and intersect with the active areas 12 at the included angle θ, thereby exposing the digit line contact area 12a of each active area 12. As shown in FIG. 2B, the depth of each of the BDL trenches 22 is well controlled such that the conductive portion 162 of each buried word line 16 is not exposed. Subsequently, a conformal liner layer 210 such as a silicon nitride liner is blanket-deposited into each BDL trench 22, but does not completely fill up the BDL trench 22. The liner layer 210 may be deposited using chemical vapor deposition (CVD) or atomic layer deposition (ALD) methods, but is not limited thereto. In some embodiments, the liner layer 210 may cover the area outside the BDL trenches 22.

Figure 3A:
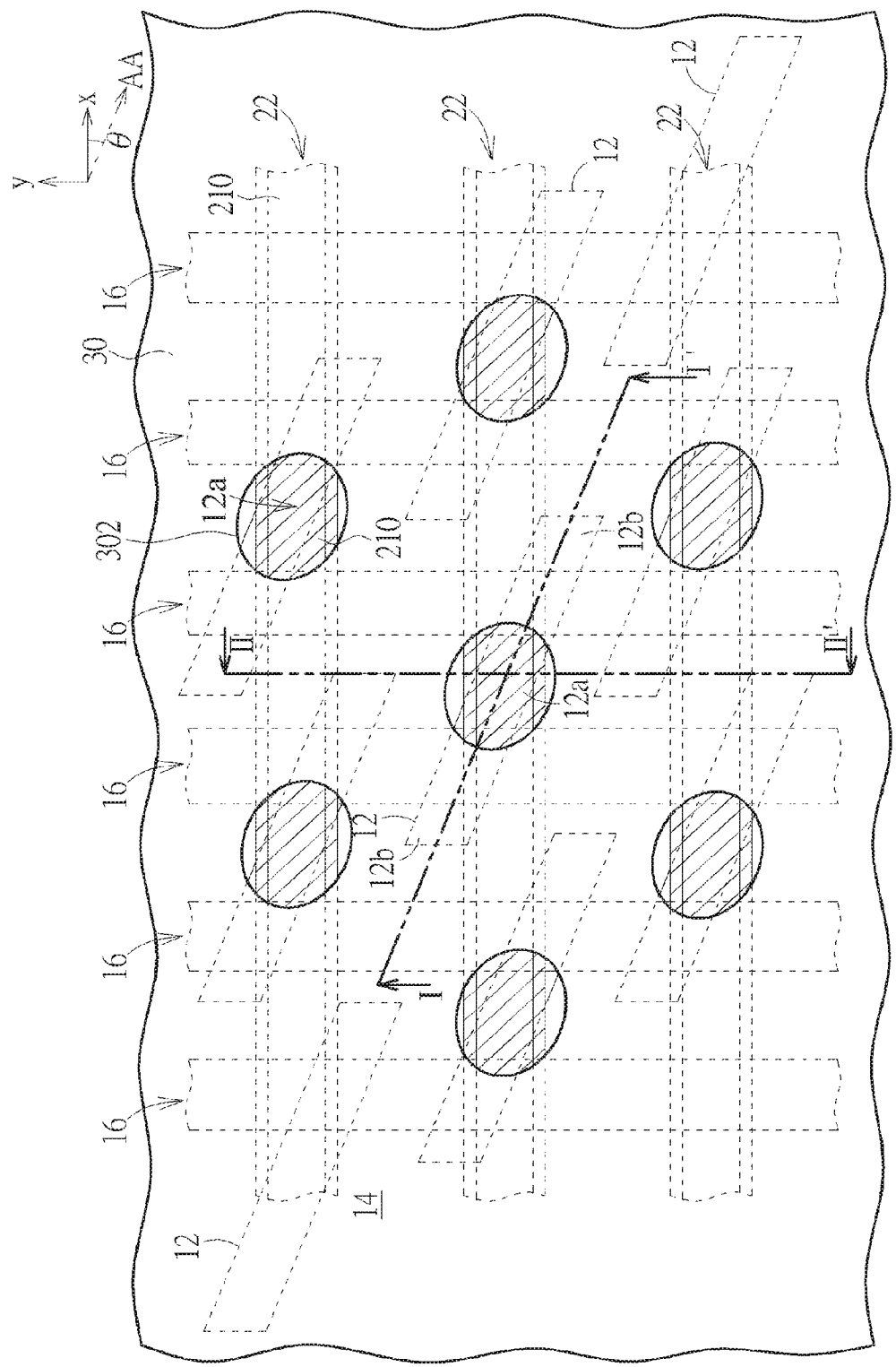
Figure 3B:
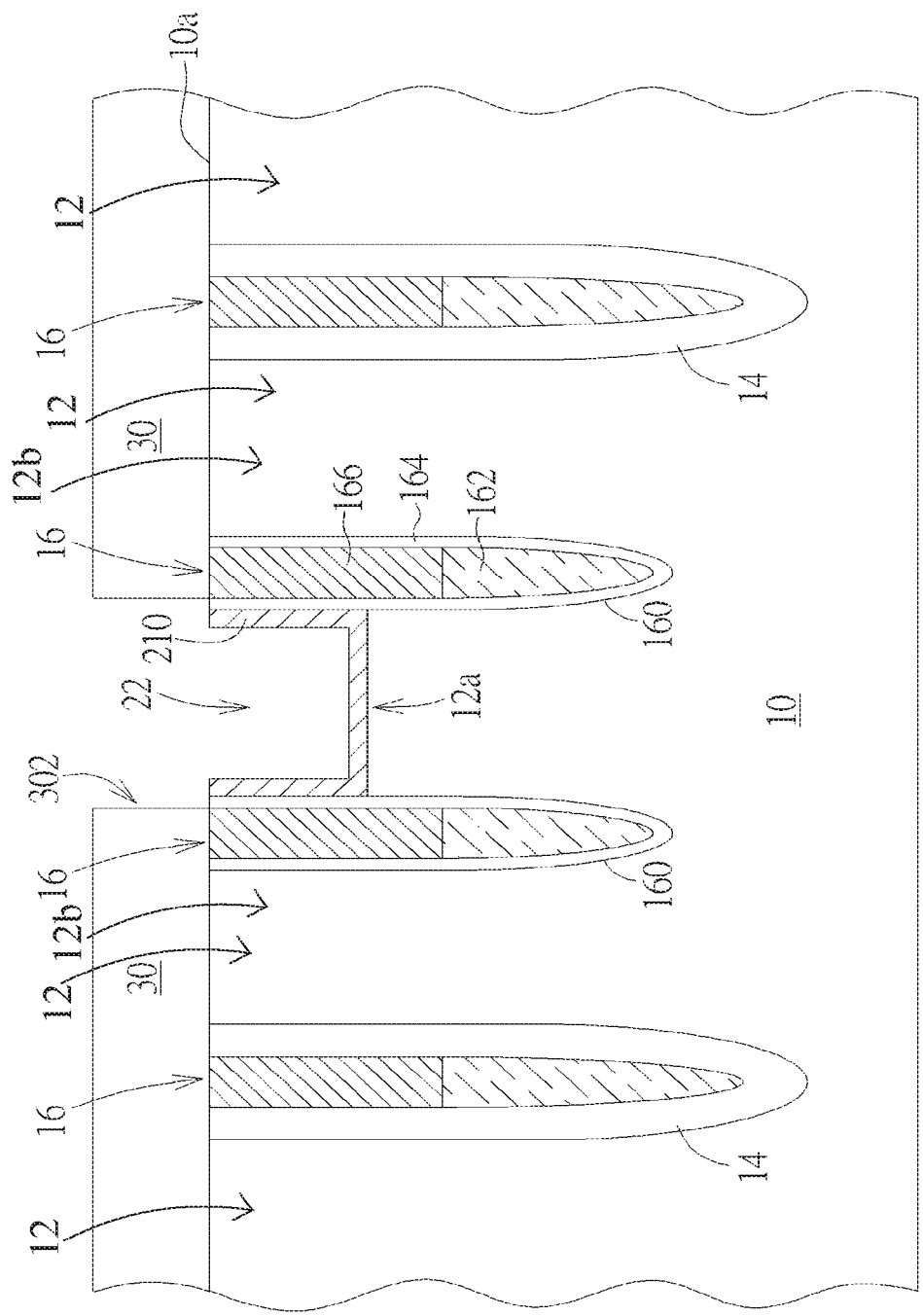
Figure 3C:
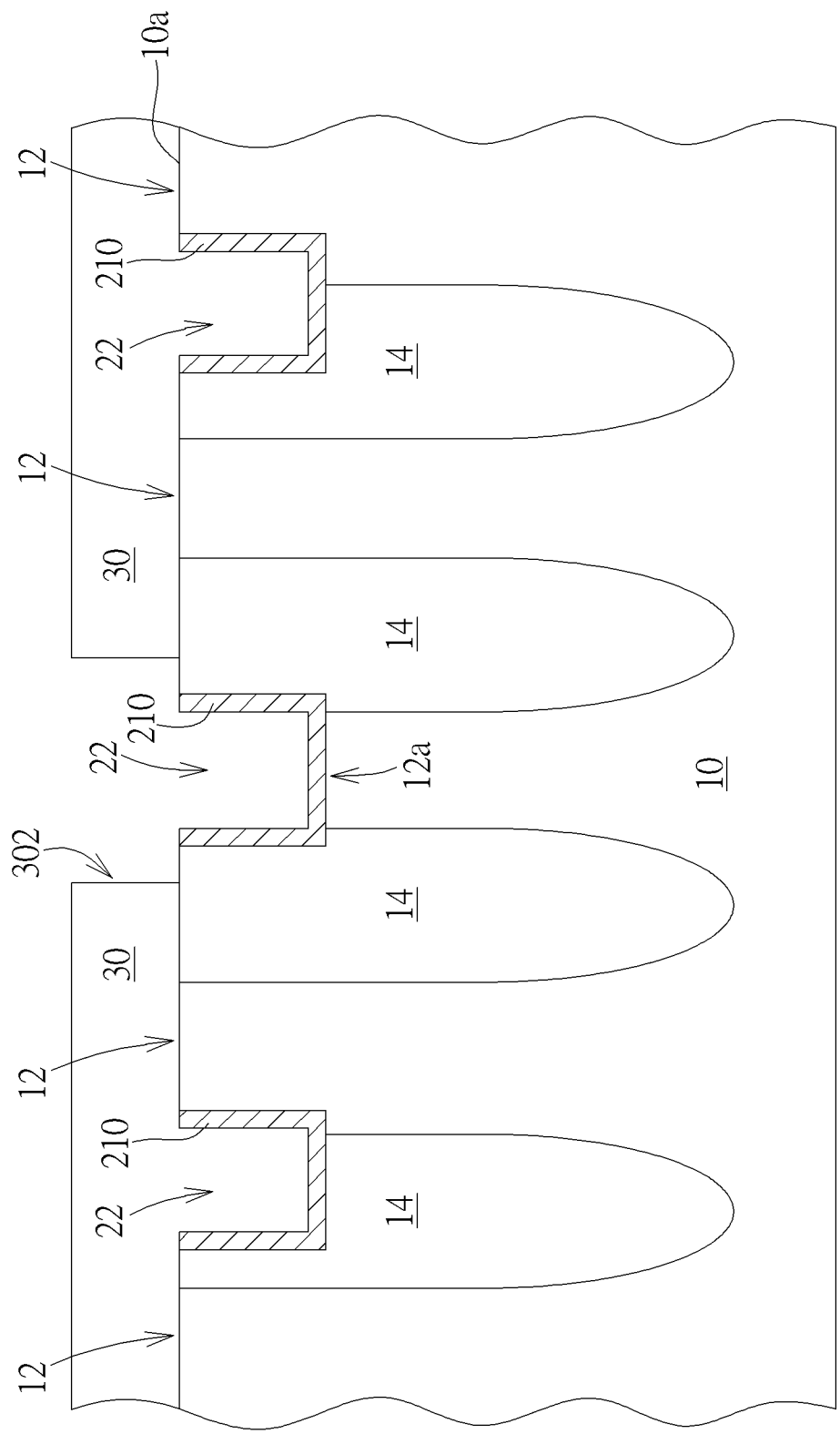

Please refer to FIGS. 3A, 3B and 3C. FIG. 3A is a top view of the schematic layout of the memory array of the memory device after the formation of digit line contact openings in the photoresist layer according to the embodiment of the invention. FIGS. 3B and 3C are schematic, cross-sectional views taken along lines I-I' and II-II', respectively, in FIG. 3A. As shown in FIGS. 3A, 3B and 3C, a photoresist layer 30 is formed over the semiconductor substrate 10. A plurality of openings 302 is formed in the photoresist layer 30 to expose portions of the liner layer 210 in respective digit line contact areas 12*a* where the line-shaped BDL trenches 22 intersect with each of the active areas 12. The openings 302 are aligned with the digit line contact areas 12*a* to thereby expose only the portions of the liner layer 210, which are situated directly above the digit line contact areas 12*a*. Subsequently, an etching process is performed to etch away the exposed portions of the liner layer 210 through the openings 302, thereby exposing surfaces of the semiconductor substrate 10 within the digit line contact areas 12*a*. The remaining photoresist layer 30 is removed.

Figure 4A:
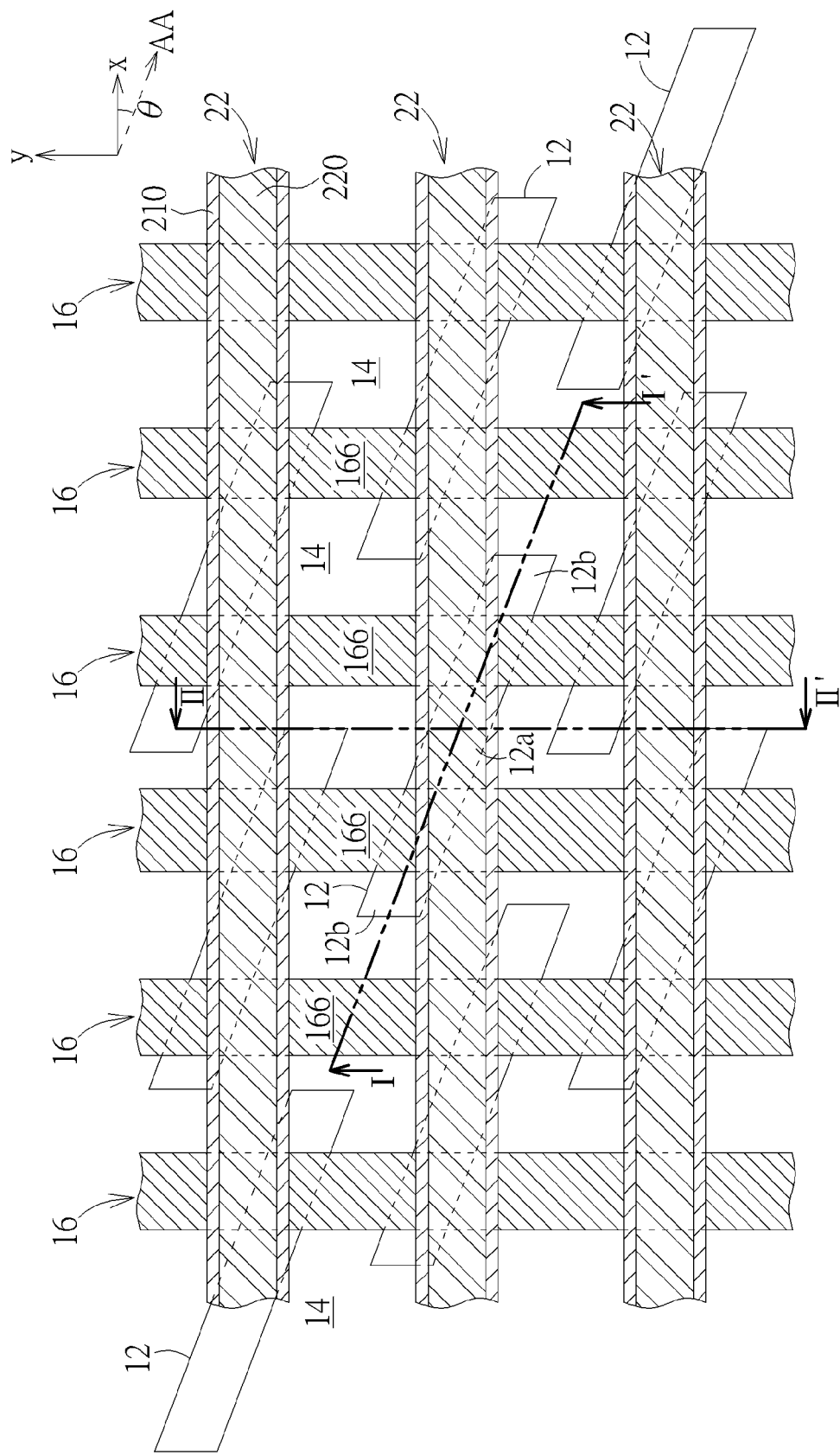
Figure 4B:
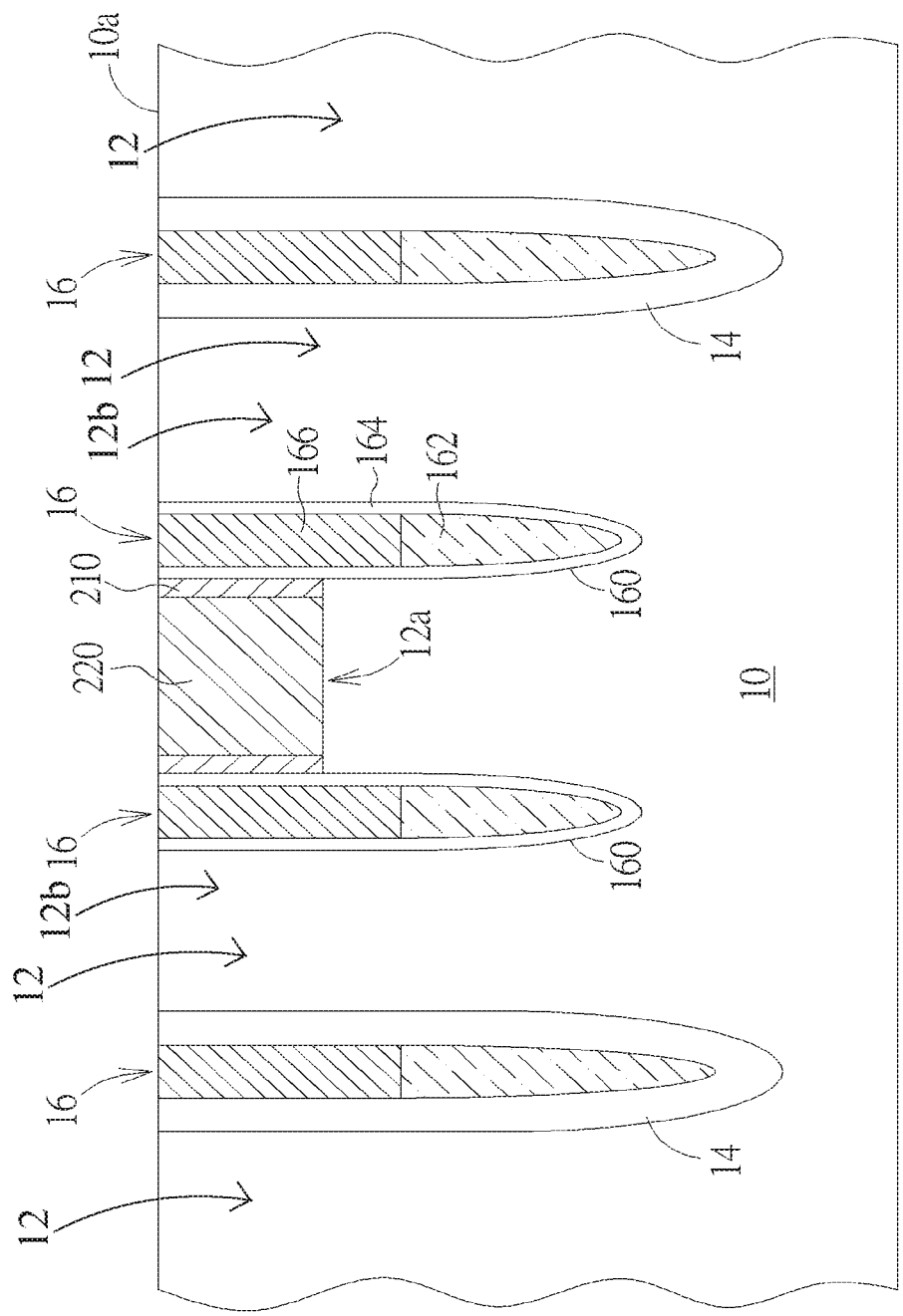
Figure 4C:
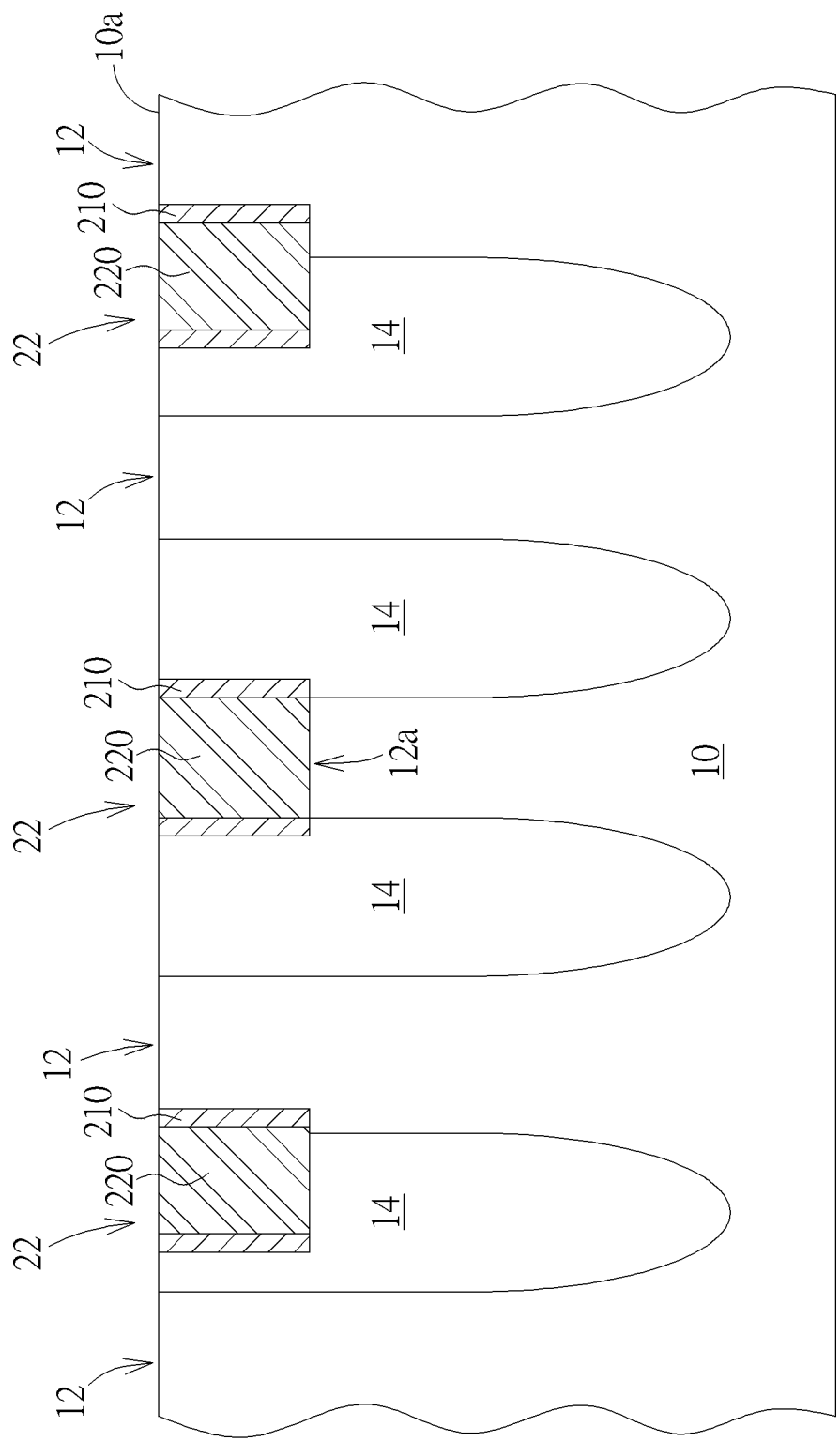

Please refer to FIGS. 4A, 4B and 4C. FIG. 4A is a top view of the schematic layout of the memory array of the memory device after filling the BDL trenches 22 with metal according to the embodiment of the invention. FIGS. 4B and 4C are schematic, cross-sectional views taken along lines I-I' and II-II', respectively, in FIG. 4A. As shown in FIGS. 4A, 4B and 4C, after etching the liner layer 210 through the openings 302, a metal layer 220 comprising, for example, Ti, TiN or W, is deposited into the BDL trenches 22. The metal layer 220 is insulated from the active areas 12 by the liner layer 210 except for the surface of the semiconductor substrate 10 within the digit line contact areas 12*a*. As can be seen in FIGS. 4B and 4C, the metal layer 220 is electrically connected to the semiconductor substrate 10 within the digit line contact areas 12*a*. According to the embodiment, the BDL trenches 22 are completely filled up with the metal layer 220. By performing suitable processes such as etching or polishing, a top surface of the metal layer 220 is flush with the top surface 10*a* of the substrate 10, the top surface of the cap layer 166 and the top surface of the STI structures 14.

Figure 5A:
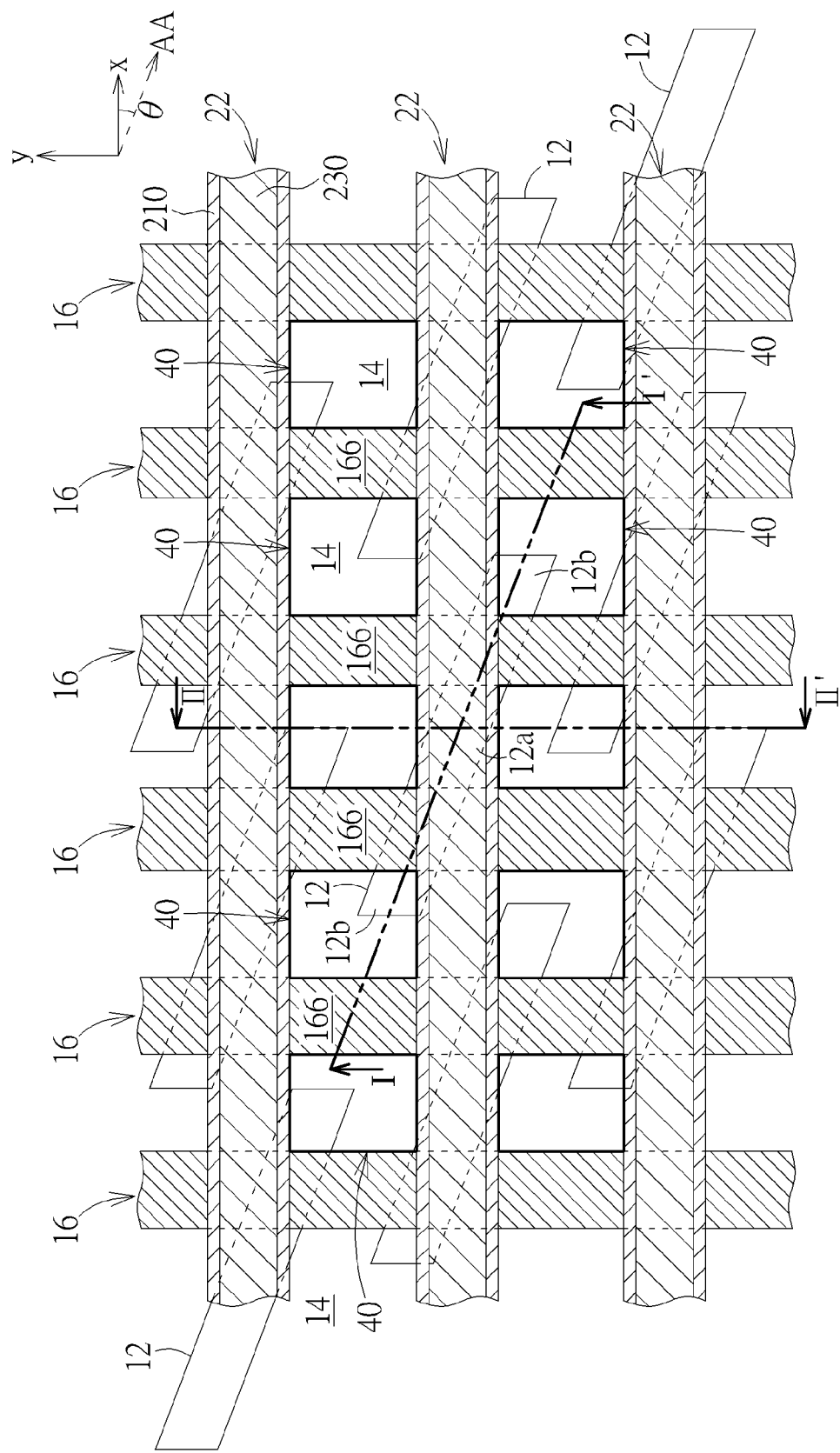
Figure 5B:
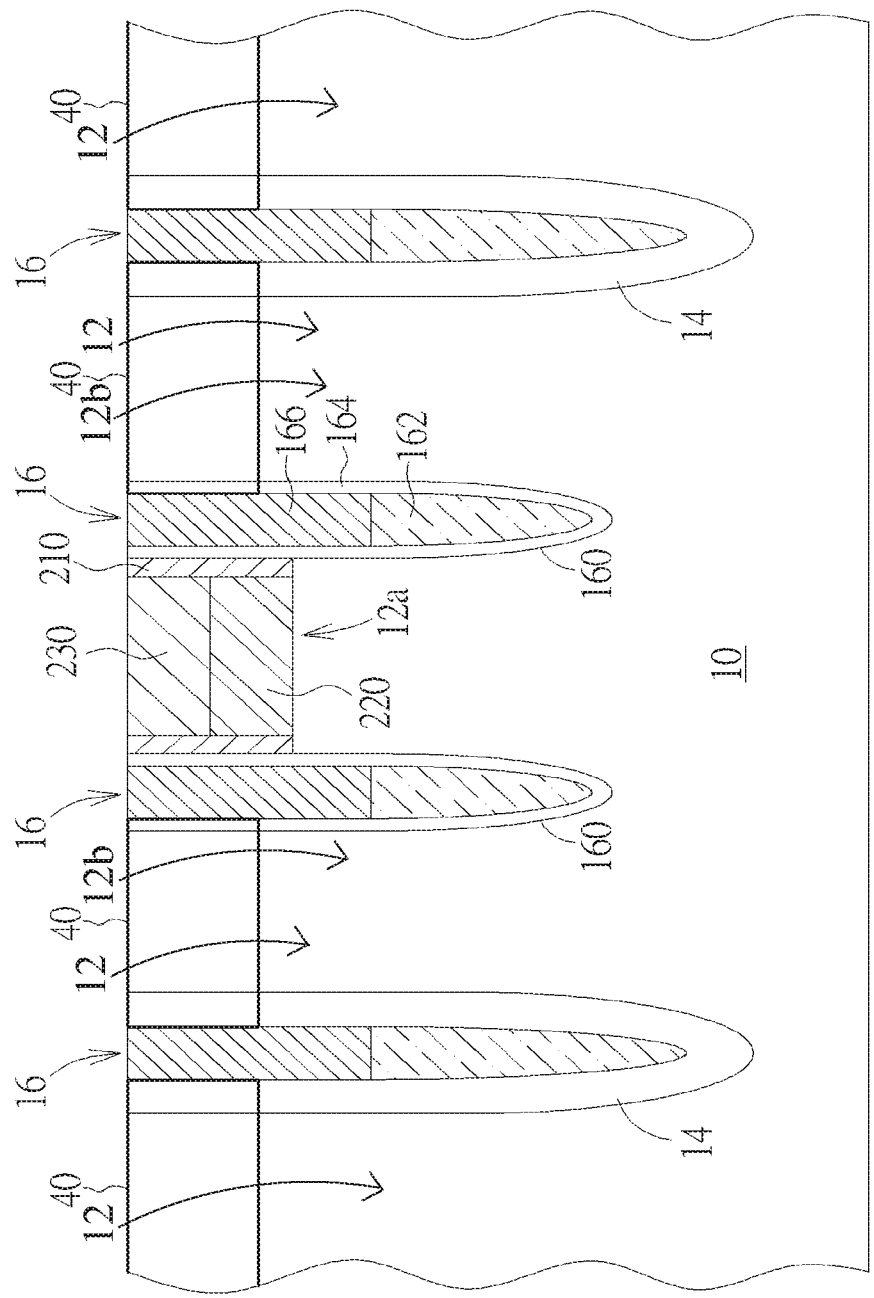
Figure 5C:
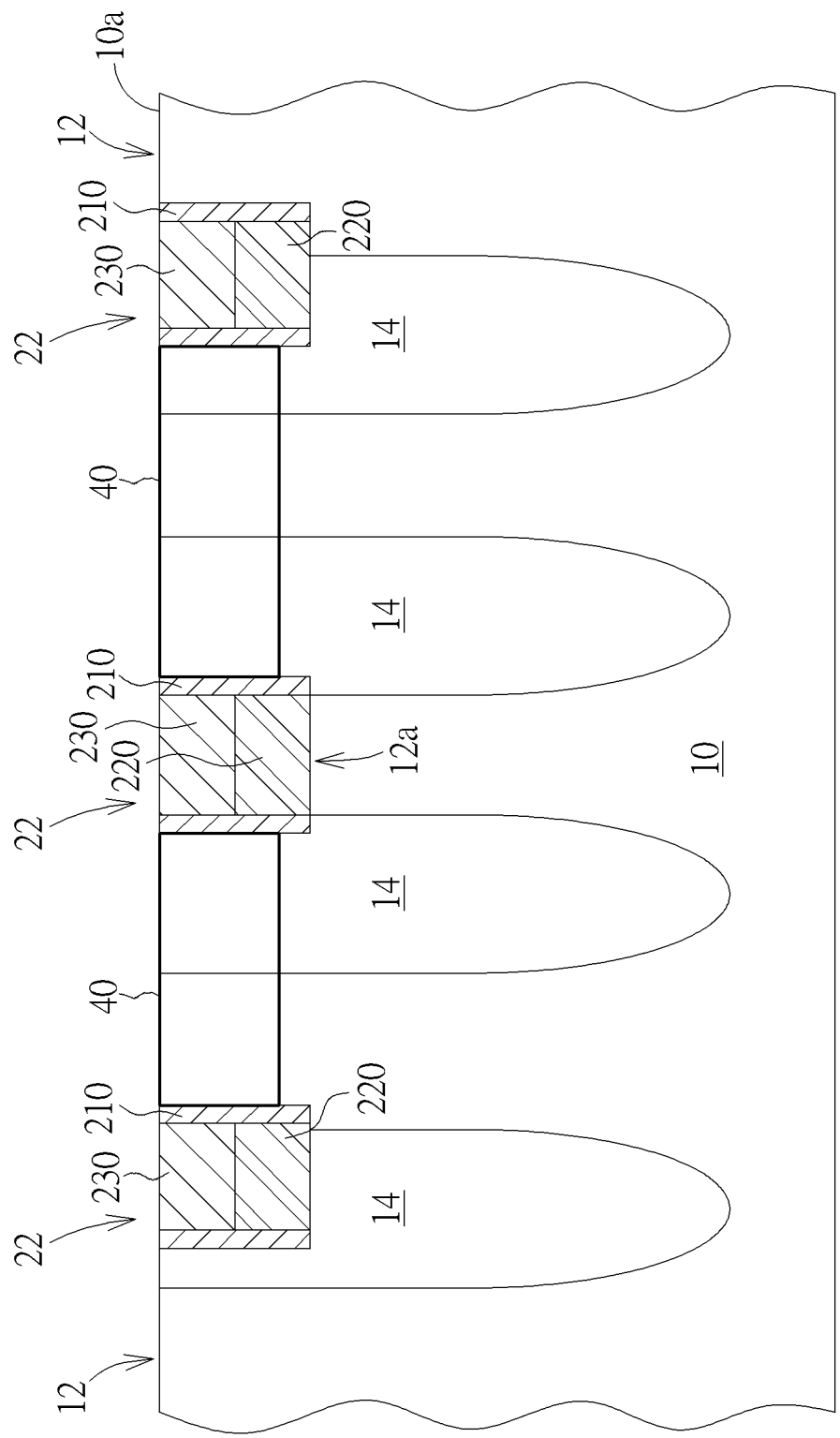

Please refer to FIGS. 5A, 5B and 5C. FIG. 5A is a top view of the schematic layout of the memory array of the memory device after forming a cap layer 230 atop the metal layer 220 according to the embodiment of the invention. FIGS. 5B and 5C are schematic, cross-sectional views taken along lines I-I' and II-II', respectively, in FIG. 5A. As shown in FIGS. 5A, 5B and 5C, the top surface of the metal layer 220 is recessed to a lower level that is lower than the top surface 10*a* of the semiconductor substrate 10. The metal layer 220 is capped with a cap layer 230. For example, the cap layer 230 may be a silicon nitride cap layer, but is not limited thereto. To form the cap layer 230, a silicon nitride layer (not shown) may be deposited over the semiconductor substrate 10 in a blanket manner. The silicon nitride layer completely fills up the recess above the metal layer 220. A chemical-mechanical polishing (CMP) process may be performed to remove excess silicon nitride layer outside the BDL trenches 22.

Further, in FIG. 5A, a plurality of square areas 40 are indicated. Each of the square areas 40 is surrounded by the SiN liner layer 210 and SiN cap layer 230 in the BDL trenches 22 in the reference x-axis direction, and the SiN cap layer 166 in the reference y-axis direction. In each square area 40, the cell contact area 12*b* of the active area 12 is exposed. It is desirable to provide a larger cell contact area in order to improve the cell contact Rc. According to the embodiment, the SiN surrounded square areas 40 constitute self-constrained epitaxial growth regions for following cell contact area enlargement.

Figure 6A:
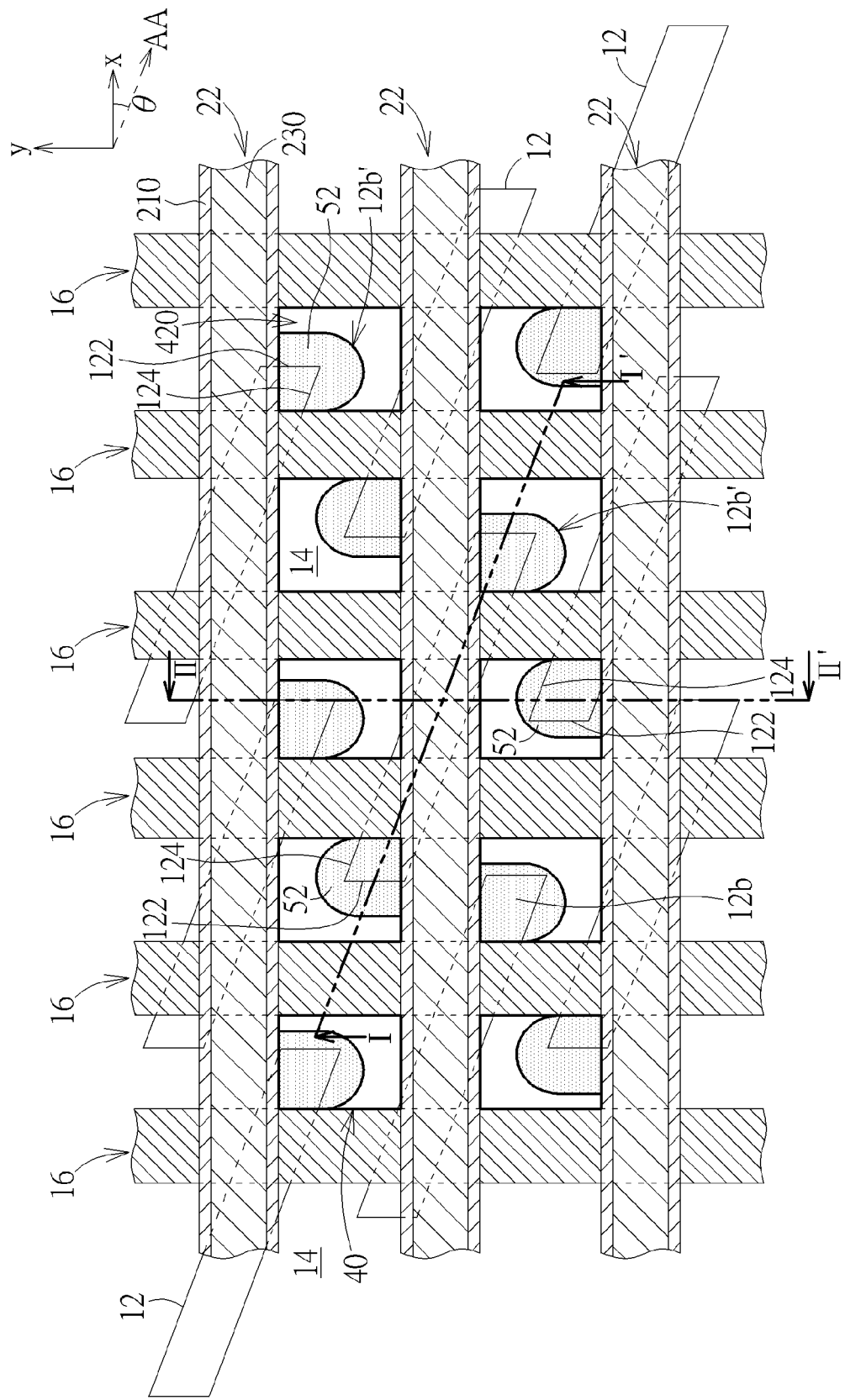
Figure 6B:
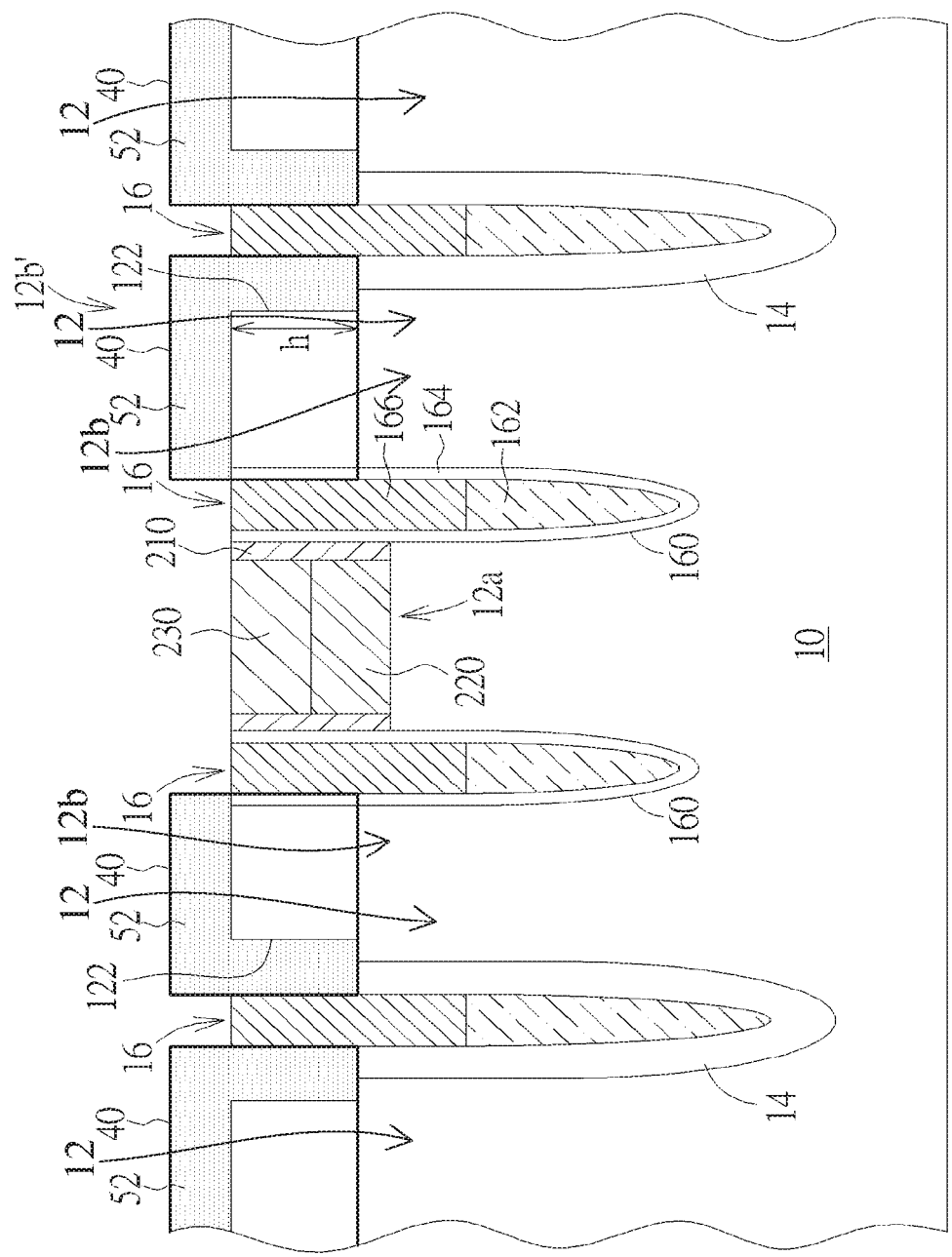
Figure 6C:
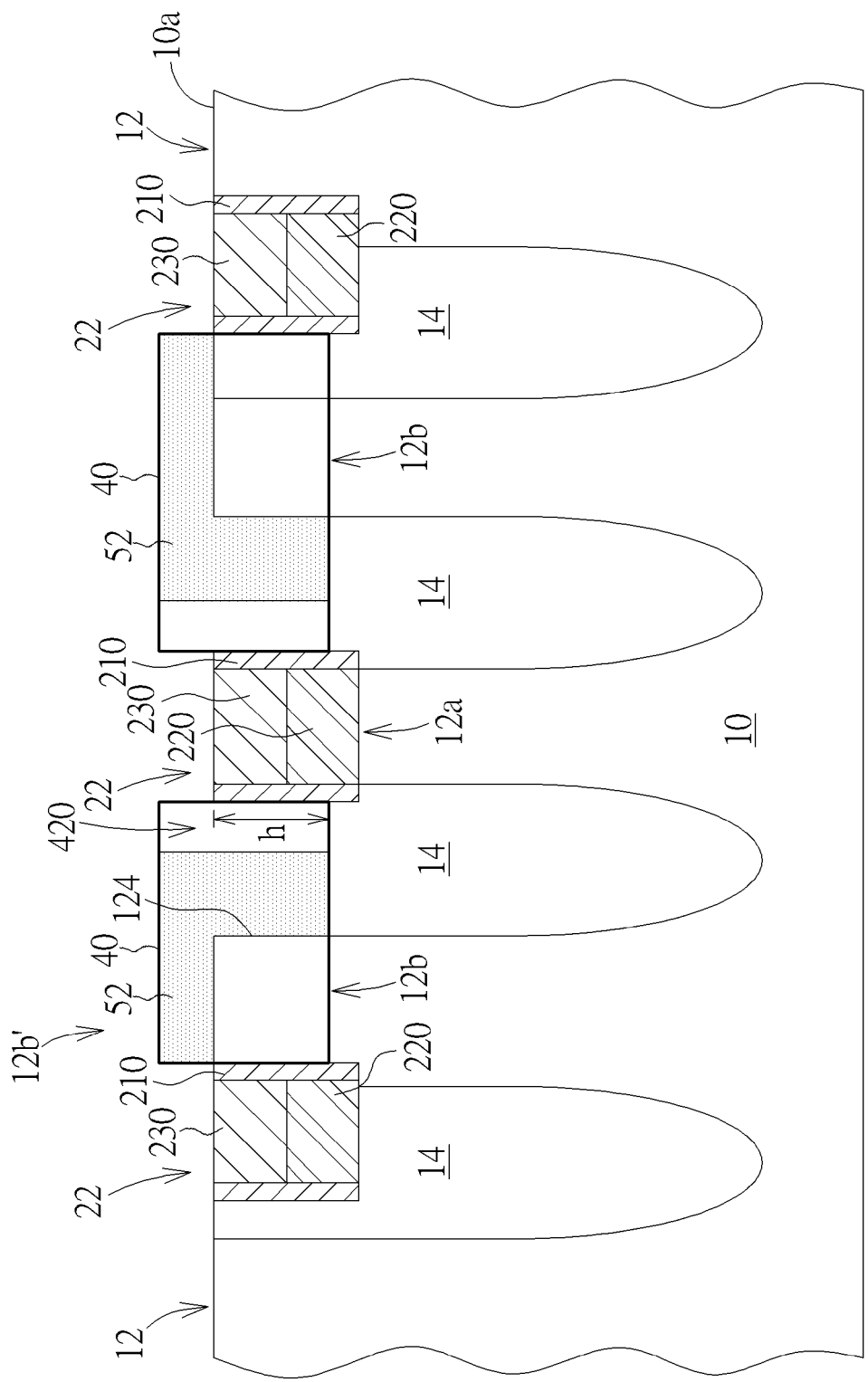

Please refer to FIGS. 6A, 6B and 6C. FIG. 6A is a top view of the schematic layout of the memory array of the memory device after oxide recess and epitaxial growth in the square areas 40, according to the embodiment of the invention. FIGS. 6B and 6C are schematic, cross-sectional views taken along lines I-I' and II-II', respectively, in FIG. 6A. As shown in FIGS. 6A, 6B and 6C, after forming the cap layer 230, an etching (oxide recess) process is performed to selectively etch away an upper portion of the STI structures 14 from each of the square areas 40. During the oxide recess process, the silicon oxide layer of the STI structures 14 may be etched by using, for example, diluted HF (DHF) or the like, which is selective to the surrounding silicon nitride cap layers and silicon. However, it is understood that the selective etching of the silicon oxide layer of the STI structures 14 may be carried out using other suitable methods, for example, a dry etching process.

As can be seen in FIGS. 6A and 6C, after the oxide recess process, an L-shaped recessed area 420 having a step height h is formed within each of the square areas 40. After removing the upper (oxide) portion of the STI structures 14 from each of the square areas 40, two adjacent sidewalls 122 and 124 of the cell contact area 12*b* (FIG. 5A) of the active area 12 are exposed. Subsequently, an epitaxial silicon growth process is performed to grow an epitaxial silicon layer 52 from the exposed cell contact area 12*b* (FIG. 5A) and the sidewalls 122 and 124, thereby forming an enlarged cell contact area 12*b*'. The epitaxial silicon layer 52 may function as a landing pad for a capacitor. The epitaxial silicon growth is confined to each square area 40 that is surrounded by the SiN cap layers extending along the reference x-axis direction and the reference y-axis direction. Therefore, shorting between adjacent cells can be avoided. It is understood that prior to the epitaxial silicon growth process, the major surface 10*a* of the semiconductor substrate 10 may be subjected to a pre-clean process.

According to the embodiment, the L-shaped recessed area 420 is not filled up with the epitaxial silicon layer 52, leaving a gap between the epitaxial silicon layer 52 and the adjacent BDL trenches 22 and the BWL trenches 160 (FIG. 6B). However, it is understood that in other embodiments, the L-shaped recessed area 420 may be completely filled up with the epitaxial silicon layer.

Figure 7A:
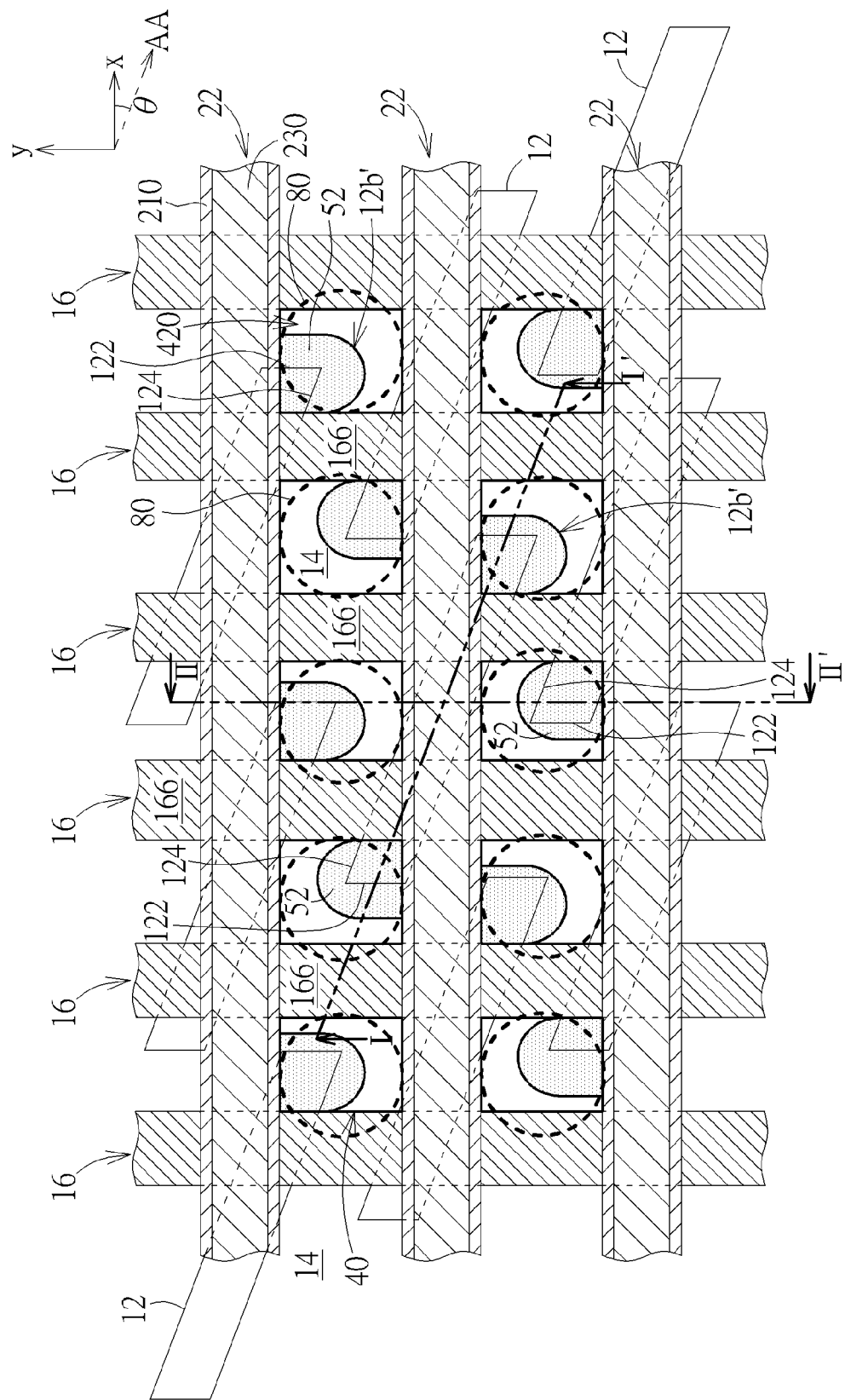
Figure 7B:
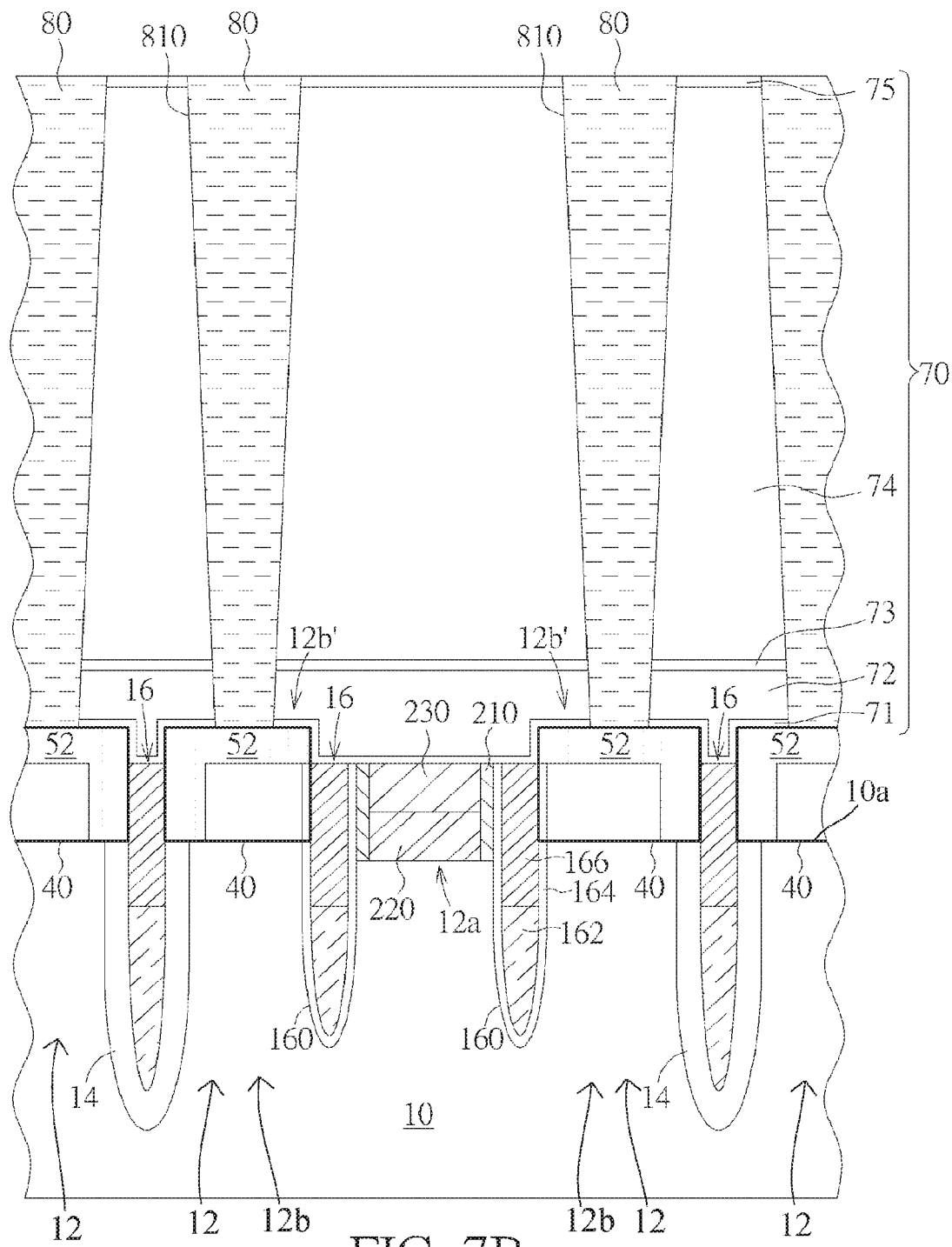
Figure 7C:
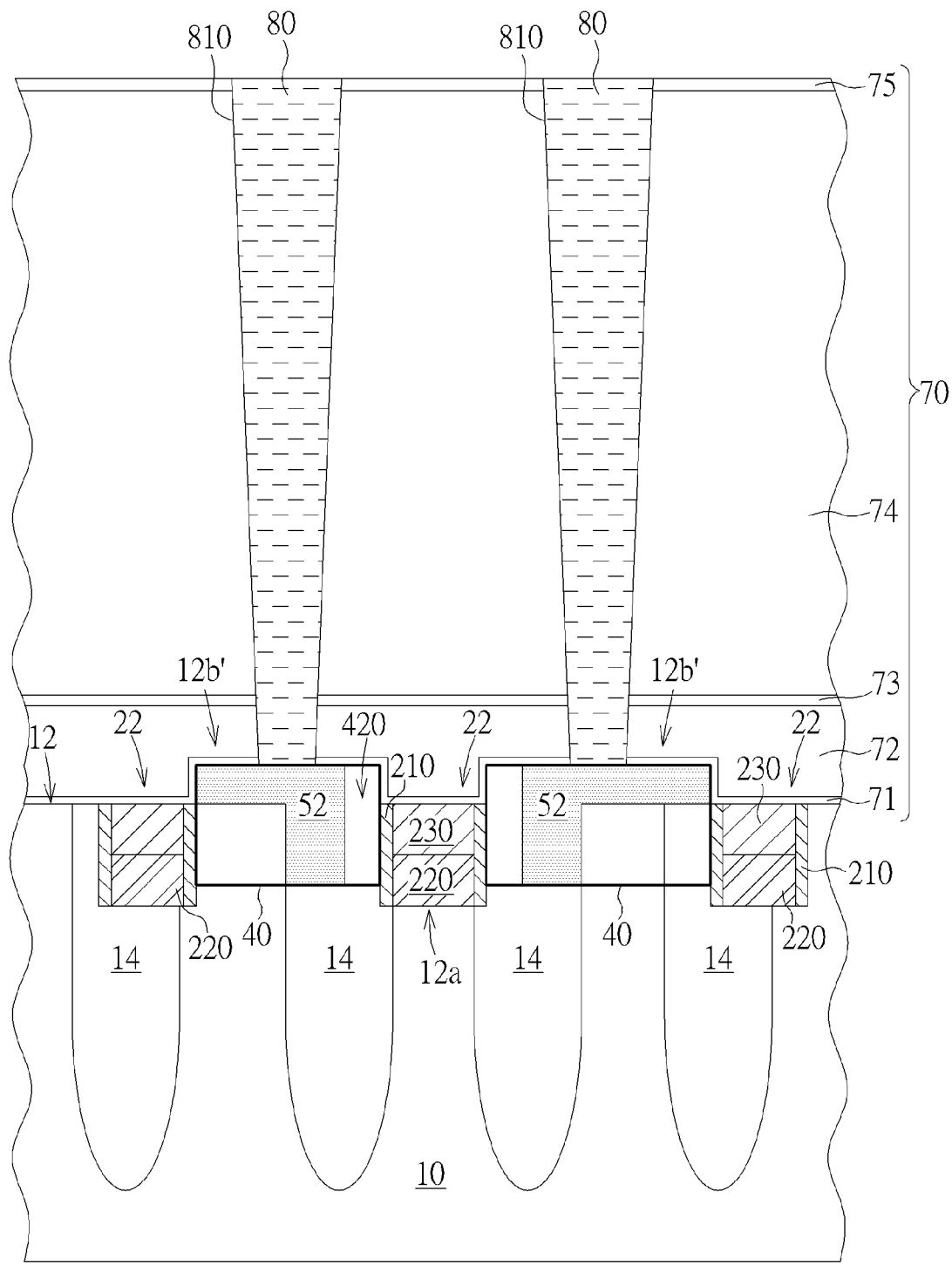

Please refer to FIGS. 7A, 7B and 7C. FIG. 7A is a top view of the schematic layout of the memory array of the memory device after forming a dielectric stack and capacitors according to the embodiment of the invention. FIGS. 7B and 7C are schematic, cross-sectional views taken along lines I-I' and II-II', respectively, in FIG. 7A. As shown in FIGS. 7A, 7B and 7C, after performing the epitaxial silicon growth process, a dielectric stack 70 may be deposited over the major surface 10*a* of the semiconductor substrate 10. For example, the dielectric stack 70 may include, but is not limited to, an etch stop layer 71, an inter-layer dielectric 72, an intermediate layer 73, an inter-layer dielectric 74, and a cap layer 75. For example, the etch stop layer 71 may comprise silicon nitride, but is not limited thereto. The inter-layer dielectric 72 and the inter-layer dielectric 74 may comprise phosphosilicate glass (PSG), borophosphosilicate glass (BPSG), silicon oxide, or low-k materials, but is not limited thereto. The cap layer 75 may comprise silicon nitride or silicon oxy-nitride, but is not limited thereto.

As shown in FIG. 7C, the etch stop layer 71 conformally covers the cap layer 166, the exposed surface of the liner layer 210 within the L-shaped recessed area 420, the epitaxial silicon layer 52, and the STI structure 14. After forming the dielectric stack 70, capacitor trenches 810 are formed in the dielectric stack 70 by using, for example, a dry etching process. A bottom of each capacitor trench 810 exposes a portion of each epitaxial silicon layer 52. A capacitor 80 is then formed within each capacitor trench 810. The capacitor 80 may comprise a bottom electrode, a capacitor dielectric layer, and a top electrode. The detailed structure of the capacitor 80 is not explicitly shown.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array, comprising:
a semiconductor substrate having thereon a plurality of active areas and a trench isolation region between the plurality of active areas, wherein each of the active areas extends along a first direction;
at least two buried word lines extending along a second direction in the semiconductor substrate, wherein the at least two of the buried word lines intersect with at least one of the active areas, the at least two of the buried word lines separating the at least one of the active areas into three portions including a digit line contact area and two cell contact areas, wherein the second direction is not perpendicular to the first direction, wherein each of the cell contact areas has exposed sidewalls and a top surface;
buried digit lines extending along a third direction in the semiconductor substrate above the buried word lines, wherein the third direction is substantially perpendicular to the second direction, wherein the buried digit lines have a top surface flush with the top surface of each of the cell contact areas; and
an epitaxial silicon layer extending from the exposed sidewalls and the top surface of each of the cell contact areas, wherein the epitaxial silicon layer has a top surface higher than the top surface of the buried digit lines.

2. The memory array according to claim 1, wherein the buried digit lines intersect with the active areas at an acute angle θ.

3. The memory array according to claim 2, wherein the acute angle θ ranges between 15°-60°.

4. The memory array according to claim 1, further comprising a capacitor directly landing on the epitaxial silicon layer.

5. The memory array according to claim 1, wherein each of the buried word lines comprises a conductive portion, a first cap layer situated atop the conductive portion, and an insulating layer between the conductive portion and the semiconductor substrate.

6. The memory array according to claim 5, wherein the first cap layer extends along the second direction.

7. The memory array according to claim 6, wherein each of the buried digit lines comprises a second cap layer extending along the third direction, and wherein the first cap layer intersects with the second cap layer.

8. The memory array according to claim 7, wherein the epitaxial silicon layer is surrounded by the first cap layer and the second cap layer.

9. The memory array according to claim 1, further comprising a recessed area between the digit line contact area and the epitaxial silicon layer.

10. The memory array according to claim 9, wherein the recessed area is directly above the trench isolation region.

* * * * *